United States Patent
Fields et al.

(10) Patent No.: US 12,270,103 B2
(45) Date of Patent: Apr. 8, 2025

(54) PLASMA-ENHANCED ATOMIC LAYER DEPOSITION WITH RADIO-FREQUENCY POWER RAMPING

(71) Applicant: Lam Research Corporation, Fremont, CA (US)

(72) Inventors: Jeremy David Fields, Portland, OR (US); Frank Loren Pasquale, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/755,630

(22) PCT Filed: Nov. 5, 2020

(86) PCT No.: PCT/US2020/059140
§ 371 (c)(1),
(2) Date: May 4, 2022

(87) PCT Pub. No.: WO2021/092197
PCT Pub. Date: May 14, 2021

(65) Prior Publication Data
US 2022/0351940 A1    Nov. 3, 2022

Related U.S. Application Data

(60) Provisional application No. 62/933,227, filed on Nov. 8, 2019.

(51) Int. Cl.
  *C23C 16/40*      (2006.01)
  *C23C 16/455*     (2006.01)
  (Continued)

(52) U.S. Cl.
  CPC ...... *C23C 16/45529* (2013.01); *C23C 16/401* (2013.01); *C23C 16/45536* (2013.01);
  (Continued)

(58) Field of Classification Search
  None
  See application file for complete search history.

(56) References Cited

U.S. PATENT DOCUMENTS 5,879,459 A    3/1999   Gadgil et al.
6,042,652 A    3/2000   Hyun et al.
(Continued)

FOREIGN PATENT DOCUMENTS

CN    1853003 A      10/2006
CN    101330015 A    12/2008
(Continued)

OTHER PUBLICATIONS

CN Office Action dated Jul. 13, 2022 in Application No. CN201710291562.X with English translation.
(Continued)

*Primary Examiner* — Jose I Hernandez-Kenney
(74) *Attorney, Agent, or Firm* — Weaver Austin Villeneuve & Sampson LLP

(57) ABSTRACT

Methods and apparatuses for depositing thin films using plasma-enhanced atomic layer deposition (PEALD) with ramping radio-frequency (RF) power are provided herein. Embodiments involve increasing the RF power setting of PEALD cycles after formation of initial screening layers at low RF power settings.

18 Claims, 7 Drawing Sheets

(51) Int. Cl.
 *C23C 16/505* (2006.01)
 *H01J 37/32* (2006.01)
(52) U.S. Cl.
 CPC ...... *C23C 16/45542* (2013.01); *C23C 16/505* (2013.01); *H01J 37/32137* (2013.01); *H01J 37/32146* (2013.01)

(56) References Cited

U.S. PATENT DOCUMENTS

| | | | |
|---|---|---|---|
| 6,124,217 | A | 9/2000 | Sun et al. |
| 6,143,082 | A | 11/2000 | McInerney et al. |
| 6,860,965 | B1 | 3/2005 | Stevens |
| 8,119,527 | B1 | 2/2012 | Chadrashekar et al. |
| 8,637,411 | B2 | 1/2014 | Swaminathan et al. |
| 8,728,956 | B2 | 5/2014 | LaVoie et al. |
| 8,940,646 | B1 | 1/2015 | Chandrasekharan et al. |
| 8,956,983 | B2 | 2/2015 | Swaminathan et al. |
| 9,076,646 | B2 | 7/2015 | Sims et al. |
| 9,263,350 | B2 | 2/2016 | Kapoor et al. |
| 9,355,886 | B2 | 5/2016 | Swaminathan et al. |
| 9,502,238 | B2 | 11/2016 | Danek et al. |
| 9,677,176 | B2 | 6/2017 | Chandrasekharan et al. |
| 9,797,042 | B2 | 10/2017 | Nowak et al. |
| 10,577,691 | B2 | 3/2020 | Nowak et al. |
| 10,697,059 | B2 | 6/2020 | Phillips et al. |
| 11,286,560 | B2 | 3/2022 | Phillips et al. |
| 12,077,859 | B2 | 9/2024 | Karim et al. |
| 2002/0100418 | A1 | 8/2002 | Sandhu et al. |
| 2005/0019963 | A1 | 1/2005 | Zhao et al. |
| 2005/0031786 | A1 | 2/2005 | Lee et al. |
| 2006/0166501 | A1 | 7/2006 | Kaushal et al. |
| 2006/0210723 | A1 | 9/2006 | Ishizaka |
| 2006/0280868 | A1 | 12/2006 | Kato et al. |
| 2007/0099420 | A1* | 5/2007 | Dominguez ...... C23C 16/45525 257/E21.171 |
| 2007/0235059 | A1 | 10/2007 | Chu et al. |
| 2008/0131601 | A1 | 6/2008 | Kim et al. |
| 2008/0242116 | A1* | 10/2008 | Clark ................ H01L 21/3185 438/791 |
| 2009/0325366 | A1 | 12/2009 | Moriya et al. |
| 2012/0009802 | A1 | 1/2012 | LaVoie et al. |
| 2012/0288615 | A1 | 11/2012 | Jung |
| 2012/0325145 | A1 | 12/2012 | Satoyoshi et al. |
| 2013/0045548 | A1 | 2/2013 | Käppeler et al. |
| 2013/0196078 | A1 | 8/2013 | Yudovsky et al. |
| 2013/0210241 | A1 | 8/2013 | LaVoie et al. |
| 2014/0030444 | A1 | 1/2014 | Swaminathan et al. |
| 2014/0113457 | A1* | 4/2014 | Sims ................ H01L 21/02167 438/778 |
| 2015/0017812 | A1 | 1/2015 | Chandrasekharan et al. |
| 2015/0329206 | A1* | 11/2015 | Larson ...................... B60P 7/08 244/118.1 |
| 2015/0332912 | A1 | 11/2015 | Nowak et al. |
| 2015/0348854 | A1 | 12/2015 | Kapoor et al. |
| 2016/0020092 | A1 | 1/2016 | Kang et al. |
| 2016/0079054 | A1 | 3/2016 | Chen et al. |
| 2016/0090650 | A1 | 3/2016 | Qian et al. |
| 2016/0340782 | A1 | 11/2016 | Chandrasekharan et al. |
| 2016/0348242 | A1 | 12/2016 | Sung et al. |
| 2017/0029947 | A1 | 2/2017 | Kawahara et al. |
| 2017/0029948 | A1 | 2/2017 | Jongbloed et al. |
| 2017/0314129 | A1 | 11/2017 | Karim et al. |
| 2017/0316988 | A1 | 11/2017 | Kang et al. |
| 2018/0010250 | A1 | 1/2018 | Nowak et al. |
| 2018/0247875 | A1* | 8/2018 | Kang ................ H01L 21/02219 |
| 2018/0358271 | A1 | 12/2018 | David |
| 2019/0085448 | A1 | 3/2019 | Phillips et al. |
| 2019/0189454 | A1* | 6/2019 | Fukazawa ......... H01L 21/32051 |
| 2019/0344307 | A1* | 11/2019 | Singh .................... C09D 183/04 |
| 2019/0345608 | A1* | 11/2019 | Agarwal ........... C23C 16/45538 |
| 2020/0299838 | A1 | 9/2020 | Phillips et al. |
| 2020/0333774 | A1 | 10/2020 | Banna |
| 2022/0154336 | A1 | 5/2022 | Karim et al. |
| 2022/0285232 | A1 | 9/2022 | Baryshnikov et al. |

FOREIGN PATENT DOCUMENTS

| | | |
|---|---|---|
| CN | 102191483 A | 9/2011 |
| CN | 102758191 A | 10/2012 |
| CN | 102839360 A | 12/2012 |
| CN | 105088197 A | 11/2015 |
| CN | 105463408 A | 4/2016 |
| CN | 105914280 A | 8/2016 |
| CN | 107799390 A | 3/2018 |
| JP | H09213689 A | 8/1997 |
| JP | 2004068091 A | 3/2004 |
| JP | 2008513980 A | 5/2008 |
| JP | 2013526017 A | 6/2013 |
| JP | 2014523479 A | 9/2014 |
| JP | 2015209355 A | 11/2015 |
| JP | 2015220458 A | 12/2015 |
| JP | 2016046524 A | 4/2016 |
| JP | 2017045927 A | 3/2017 |
| JP | 2021125566 A | 8/2021 |
| KR | 20070000279 A | 1/2007 |
| KR | 100715862 B1 | 5/2007 |
| KR | 20110055496 A | 5/2011 |
| KR | 20130086989 A | 8/2013 |
| KR | 20130093569 A | 8/2013 |
| KR | 20130115261 A | 10/2013 |
| KR | 20130127588 A | 11/2013 |
| KR | 20130136034 A | 12/2013 |
| KR | 20140037198 A | 3/2014 |
| KR | 20140051807 A | 5/2014 |
| KR | 20150133644 A | 11/2015 |
| KR | 20160038783 A | 4/2016 |
| KR | 20160127674 A | 11/2016 |
| TW | I277139 B | 3/2007 |
| TW | 201608612 A | 3/2016 |
| WO | WO-2011125471 A1 | 10/2011 |
| WO | WO-2012170166 A2 | 12/2012 |
| WO | WO-2014142031 A1 | 9/2014 |
| WO | WO-2020185539 A1 | 9/2020 |
| WO | WO-2021081304 A1 | 4/2021 |
| WO | WO-2022008906 A1 | 1/2022 |

OTHER PUBLICATIONS

CN Office Action dated Mar. 16, 2023, in Application No. CN201880059891.4 with English translation.
CN Office Action dated Oct. 28, 2022, in Application No. CN201710291562.X with English translation.
International Preliminary Report on Patentability dated May 19, 2022, in PCT Application No. PCT/US2020/059140.
JP Office Action dated Sep. 27, 2022, in Application No. JP2021-109808 with English translation.
TW Office Action dated Jan. 19, 2023 in Application No. TW111130779 with English translation.
TW Office Action dated May 31, 2022, in Application No. TW106113839 with English Translation.
U.S. Non-Final office Action dated Oct. 6, 2022 in U.S. Appl. No. 17/587,560.
U.S. Final office Action dated Apr. 7, 2023 in U.S. Appl. No. 17/587,560.
Chinese First Office Action dated Feb. 12, 2019, issued in Application No. CN 201710291562.X.
Chinese First Office Action dated May 24, 2017, issued in Application No. CN 201510245528.X.
Chinese Fourth Office Action dated Jul. 3, 2020 issued in Application No. CN 201710291562.X.
Chinese Second Office Action dated Feb. 23, 2018, issued in Application No. CN 201510245528.X.
Chinese Second Office Action dated Sep. 9, 2019, issued in Application No. CN 201710291562.X.
Chinese Third Office Action dated Apr. 1, 2020, issued in Application No. CN 201710291562.X.
Chinese Third Office Action dated Sep. 25, 2018, issued in Application No. CN 201510245528.X.
International Preliminary Report on Patentability dated Mar. 26, 2020 issued in Application No. PCT/US2018/049864.

(56) References Cited

OTHER PUBLICATIONS

International Search Report and Written Opinion dated Feb. 1, 2019 issued in Application No. PCT/US18/49864.
Japanese Decision to Grant dated dated Jul. 16, 2019, issued in Application No. JP 2015-095293.
Japanese Decision to Grant dated May 28, 2021 issued in Application No. JP 2017-083755.
Japanese Office Action [Reason for Refusal] dated Mar. 27, 2019, issued in Application No. JP 2015-095293.
Korean Decision for Grant dated Jun. 9, 2021 issued in Application No. KR 10-2017-0049539.
Korean Office Action dated Jun. 29, 2021, issued in Application No. KR 10-2015-0068349.
KR Office Action dated Jan. 28, 2022, in Application No. KR10-2015-0068349 with English Translation.
KR Office Action dated Jan. 10, 2022, in Application No. KR1020210120640.
Notice of Allowance dated Nov. 17, 2021, in U.S. Appl. No. 16/946,009.
PCT International Search Report and Written Opinion, dated Feb. 26, 2021, issued in PCT/US2020/059140.
Singapore Notice of Eligibility for Grant & Supplementary Examination Report dated Jan. 17, 2020 in SG Application No. 10201503283S.
Singapore Search Report and Written Opinion dated Jan. 20, 2020 in SG Application No. 10201703133P.
Taiwanese First Office Action dated Oct. 1, 2018, issued in Application No. TW 104115353.
U.S. Appl. No. 17/587,560, filed Jan. 28, 2022.
US Final Office Action, dated Aug. 15, 2019, issued in U.S. Appl. No. 15/143,338.
US Final Office Action, dated Mar. 7, 2017, issued in U.S. Appl. No. 14/455,796.
US Final Office Action dated Oct. 31, 2019 in U.S. Appl. No. 15/785,093.
US Notice of Allowance, dated Jun. 15, 2017, issued in U.S. Appl. No. 14/455,796.
US Notice of Allowance dated Mar. 4, 2020 in U.S. Appl. No. 15/785,093.
US Notice of Allowance, dated Oct. 10, 2019, issued in U.S. Appl. No. 15/703,694.
US Office Action, dated Aug. 26, 2016, issued in U.S. Appl. No. 14/455,796.
US Office Action dated Aug. 6, 2019 in U.S. Appl. No. 15/785,093.
US Office Action, dated Feb. 7, 2019, issued in U.S. Appl. No. 15/143,338.
US Office Action, dated Jun. 13, 2019, issued in U.S. Appl. No. 15/703,694.
US Patent Board Decision on Appeal Before the Patent Trial and Appeal Board (Examiner Affirmed) dated Dec. 1, 2021 issued U.S. Appl. No. 15/143,338.
U.S Supplemental Notice of Allowability dated Mar. 3, 2022, in U.S. Appl. No. 16/946,009.
International Search Report and Written Opinion dated Jan. 11, 2023, in Application No. PCT/US2022/076848.
TW Office Action dated Oct. 16, 2023, in application No. TW112134025 with English translation.
U.S. Non-Final Office Action dated Aug. 14, 2023, in U.S. Appl. No. 17/587,560.
International Preliminary Report on Patentability and Written Opinion dated Apr. 18, 2024 in PCT Application No. PCT/US2022/076848.
SG Office Action dated Apr. 5, 2023 in SG Application No. 10202002293X.
U.S. Notice of Allowance dated Mar. 14, 2024 in U.S. Appl. No. 17/587,560.
U.S. Notice of Allowance dated Mar. 27, 2024 in U.S. Appl. No. 17/587,560.
U.S. Appl. No. 18/698,276, inventors Agnew D W, et al., filed Apr. 3, 2024.
CN Office Action dated Dec. 1, 2023, in CN Application No. 202080077774.8 with English translation.
International Search Report and Written Opinion dated Jan. 8, 2024 in PCT Application No. PCT/US2023/033209.
KR Office Action dated Jan. 17, 2024 in KR Application No. 10-2020-7010706 with English translation.
KR Office Action dated Jan. 10, 2022, in Application No. KR1020210120640 with English translation.
KR Office Action dated Jun. 12, 2024 in KR Application No. 10-2023-0172344 with English Translation.
U.S. Notice of Allowance dated Aug. 8, 2024 in U.S. Appl. No. 17/587,560.
CN Office Action dated Sep. 7, 2024 in CN Application No. 202080077774.8 with English translation.
KR Office Action dated Oct. 31, 2024 in KR Application No. 10-2020-7010706 with English Translation.

* cited by examiner

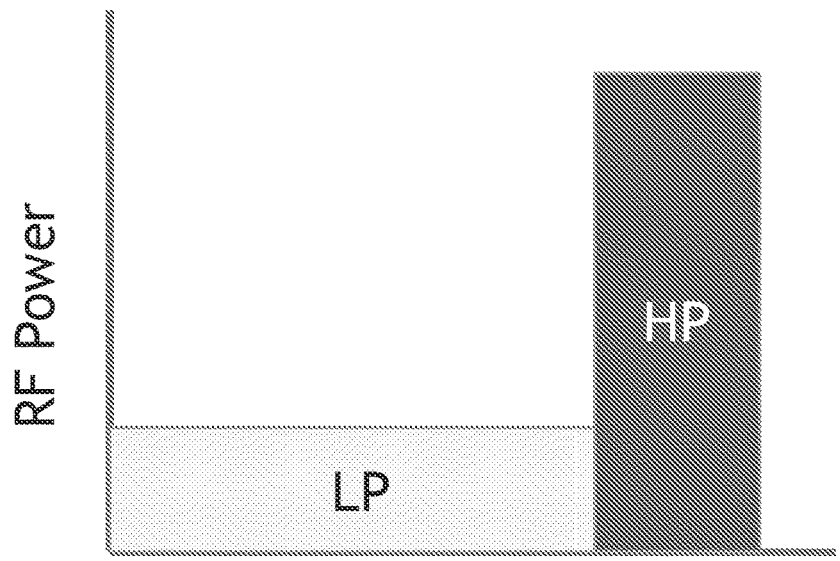
FIG. 2A
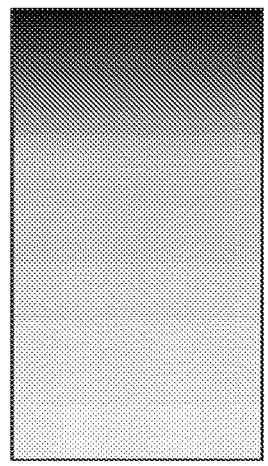
FIG. 2B
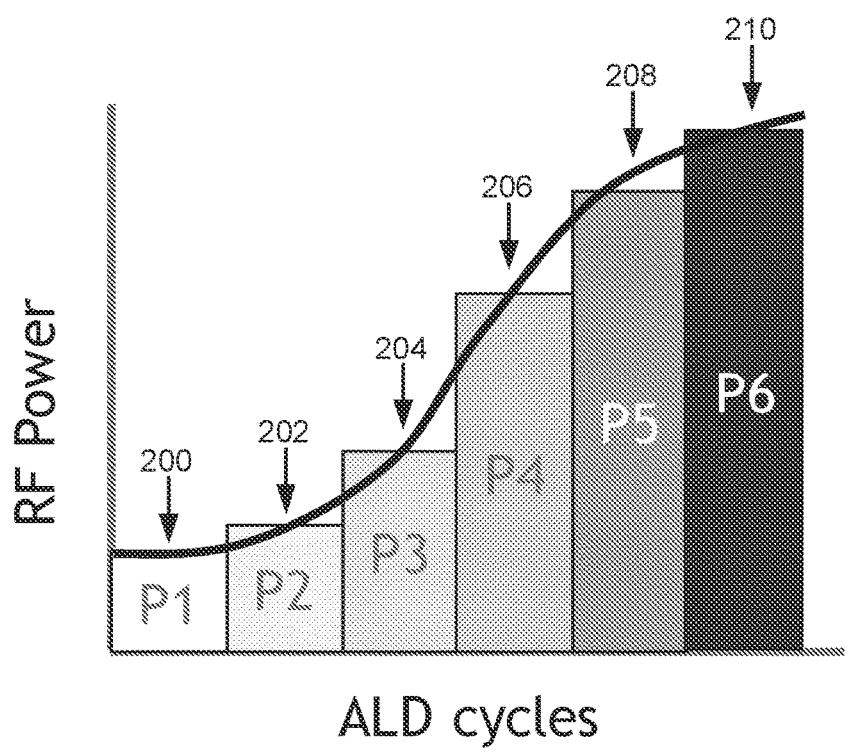
FIG. 2C
FIG. 2D

PLASMA-ENHANCED ATOMIC LAYER DEPOSITION WITH RADIO-FREQUENCY POWER RAMPING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Films of various materials, including silicon oxide films, are used in semiconductor processing for a variety of applications. Silicon oxide films may be deposited using different techniques, such as plasma-enhanced. atomic layer deposition (PEALD). As technology advances, deposition of high quality films becomes challenging.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Briefly, in certain embodiments, a method of depositing a film may include providing a substrate to a process chamber, depositing a first amount of a material over the substrate in a first plasma-enhanced atomic layer deposition (PEALD) cycle, depositing a second amount of the material over the substrate in a second PEALD cycle, and depositing a third amount of the material over the substrate in a third PEALD cycle. The method may include, as part of the first cycle, exposing the substrate to a precursor under conditions allowing the precursor to adsorb onto a surface of the substrate, thereby forming a first adsorbed layer of the precursor, and exposing the first adsorbed layer of the precursor to a first plasma generated using a first plasma power level. The method may further include, as part of the second cycle, exposing the substrate to the precursor under conditions allowing the precursor to adsorb onto the surface of the substrate, thereby forming a second adsorbed layer of the precursor, and exposing the second adsorbed layer of the precursor to a second plasma generated using a second plasma power level, where the second plasma power level may be greater than the first plasma power level and the second PEALD cycle may be performed after the first PEALD cycle. The method may also include, as part of the third cycle, exposing the substrate to the precursor under conditions allowing the precursor to adsorb onto the surface of the substrate, thereby forming a third adsorbed layer of the precursor, and exposing the third adsorbed layer of the precursor to a third plasma generated using a third plasma power level, where the third plasma power level may be greater than the second plasma power level and the third PEALD cycle may be performed after the second PEAT D cycle.

in some embodiments, the substrate may be a 300-mm wafer, the first plasma power level may be less than 1.0 kilowatts for the 300-mm wafer, and the third plasma power level may be greater than 2.0 kilowatts for the 300-mm wafer. in some embodiments, the substrate may be a 300-mm wafer, the first plasma power level may be less than 500 watts for the 300-mm wafer, and the third plasma power level may be greater than 3.5 kilowatts for the 300-mm wafer. In some embodiments, the first plasma power level may be no more than one-half of the second plasma power level. In some embodiments, the substrate may be a 300-mm wafer, the first plasma power level may be less than 1.0 kilowatts for the 300-mm wafer, and the first cycle may be repeated, including using the first plasma power level, until a thickness of the deposited material exceeds 20 angstroms. In some embodiments, the method further includes depositing a fourth amount of the material over the substrate in a fourth PEALD cycle and the fourth cycle includes exposing the substrate to the precursor under conditions allowing the precursor to adsorb onto the surface of the substrate, thereby forming a fourth adsorbed layer of the precursor, and exposing the fourth adsorbed layer of the precursor to a fourth plasma generated using a fourth plasma power level, where the fourth plasma power level may be greater than the third plasma power level and the fourth PEALD cycle may be performed after the third PEALD cycle. In some embodiments involving the fourth cycle, the substrate may be a 300-mm wafer, the first plasma power level may be less than 500 watts for the 300-mm wafer, and the fourth plasma power level may be greater than 3.5 kilowatts for the 300-mm wafer. In some embodiments, the material deposited over the substrate may be silicon oxide.

In certain embodiments, a method of depositing a film may include receiving a substrate in a process chamber and depositing a material over the substrate in plurality of plasma-enhanced atomic layer deposition (PEALD) cycles, each cycle involving exposing the substrate to a precursor under conditions allowing the precursor to adsorb onto a surface of the substrate, thereby forming an adsorbed layer of the precursor, and exposing the adsorbed layer to a plasma provided using a radio-frequency (RF) generator with a variable power setting. The method may include depositing the material over the substrate in the plurality of PEALD cycles by setting the variable power setting of the RF generator to a first power level for a first PEALD cycle, a second power level for a second PEALD cycle, and a third power level for a third PEALD cycle, where the third power level may be greater than the second power level, the second power level may be greater than the first power level, the third PEALD cycle occurs after the second. PEALD cycle, and the second PEALD cycle occurs after the first PEALD cycle.

in some embodiments, the substrate may be a single wafer, the first plasma power level may be less than 1.0 kilowatts for the single wafer, and the third plasma power level may be greater than 2.0 kilowatts for the single wafer. In some embodiments, the substrate may be a single wafer, the first plasma power level may be less than 500 watts for the single wafer, and the third plasma power level may be greater than 3.5 kilowatts for the single wafer. In some embodiments, the first plasma power level may be no more than one-half of the third plasma power level. In some embodiments, the substrate may be a single wafer, the first plasma power level may be less than 1.0 kilowatts for the single wafer, and the first cycle may be repeated, including using the first plasma power level, until a thickness of the deposited material exceeds 20 angstroms. In some embodiments, depositing the material over the substrate in the plurality of PEALD cycles includes setting the variable power setting of the RF generator to a fourth power level for a fourth PEALD cycle, where the fourth power level may be greater than the third power level and the fourth PEALD occurs after the third PEALD cycle. In some embodiments, the substrate may be a single wafer, the first plasma power level may be less than 500 watts for the single wafer, and the fourth plasma power level may be greater than 3.5 kilowatts for the single wafer. In some embodiments, the material deposited over the substrate may be silicon oxide.

In certain embodiments, an apparatus for processing substrates may include one or more process chambers, one or more gas inlets into the one or more process chambers and associated flow control hardware, a plasma generator; and a controller having at least one processor and a memory, whereby the at least one processor and the memory may be communicatively connected with one another, the at least one processor may be at least operatively connected with the flow control hardware, and the memory may store computer-executable instructions for controlling the at least one processor to at least control the flow control hardware to cause insertion of a substrate to at least one of the one or more process chambers, cause introduction of a first set of alternating flows of a silicon-containing precursor and an oxidant into the at least one of the one or more process chambers via the one or more gas inlets;, cause generation of a plasma having a first plasma power level when causing introduction of the oxidant during the first set to form a silicon oxide material, cause introduction of a second set of alternating flows of the silicon-containing precursor and the oxidant into the at least one of the one or more process chambers via the one or more gas inlets, cause generation of a plasma having a second plasma power level when introducing the oxidant during the second set to form a silicon oxide material, cause introduction of a third set of alternating flows of the silicon-containing precursor and the oxidant into the at least one of the one or more process chambers via the one or more gas inlets, and cause generation of a plasma having a third plasma power level when introducing the oxidant during the second set to form a silicon oxide material, where the third plasma power level may be at least two times greater than the first plasma power level and the second plasma power level may be greater than the first plasma power level and lower than the third plasma power level.

In some embodiments, the at least one of the one or more process chambers may include a powered showerhead and a grounded pedestal to hold the substrate. In some embodiments, the at least one of the one or more process chambers may include a powered pedestal to hold the substrate and a grounded showerhead.

BRIEF DESCRIPTION OF THE DRAWINGS

FIGS. 2A and 2C are diagrams depicting RF power as a function of PEALD cycle number in accordance with certain disclosed embodiments.

FIGS. 2B and 2D depict variations in films formed with the PEALD processes of FIGS. 2A and 2C in accordance with certain disclosed embodiments.

DETAILED DESCRIPTION

Figure 1A:
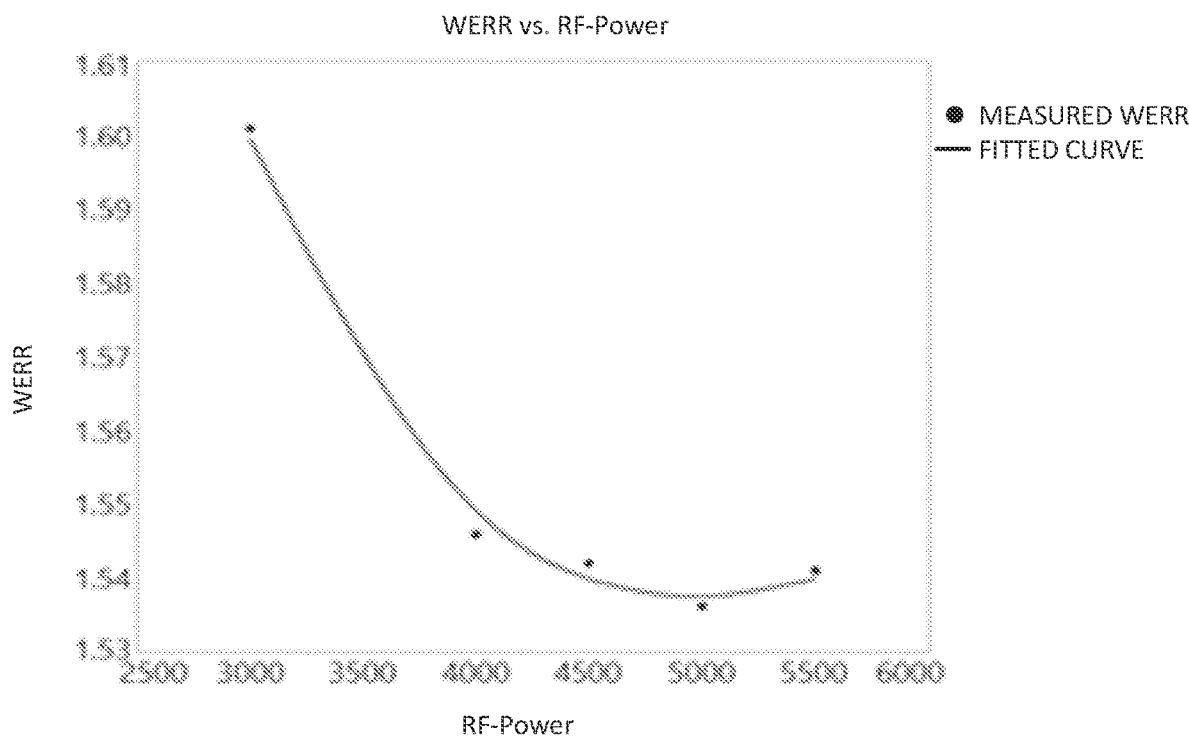
FIG. 1A is a graph depicting wet etch rate of films deposited using plasma-enhanced atomic layer deposition (PEALD) processes at various plasma power levels in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it wilt be understood that it is not intended to limit the disclosed embodiments.

ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor (also referred to as "dose"), (ii) purging of the precursor from the chamber, (iii) delivery of a second reactant and/or plasma generation (also referred to as "conversion"), and (iv) purging of byproducts from the chamber. Purging may be optional in some cases. Additionally, dose may not necessarily be performed before conversion; in some cases, delivery of the second reactant may be performed before delivering the precursor. For purposes of discussion herein, an ALD cycle will refer to dose, purging, conversion, and purging, but it will be understood that other variations may also be utilized.

Where plasma is used alone or during delivery of the second reactant, the process may be referred to as plasma-enhanced atomic layer deposition (PEALD). The reaction between the second reactant and the adsorbed precursor to form a film on the surface of a substrate affects the film composition and properties, such as stress, wet etch rate, dry etch rate, electrical properties (e.g., dielectric constant, breakdown voltage and leakage current), incorporation of impurities, etc.

In one particular example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface. The molecules may be chemisorbed and/or physisorbed on the substrate. It will be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber may then be evacuated to remove most or all of first precursor remaining in gas phase so that mostly or only the adsorbed species remain. For example, the chamber may be evacuated such that the partial pressure of the first precursor in gas phase is sufficiently low to mitigate a reaction. In some implementations, the chamber may not be fully evacuated. In some approaches, a second reactant, such as an oxygen-containing gas, is introduced to the chamber so that some of these second reactant molecules react with the adsorbed first precursor on the surface of the substrate. In some processes, the second reactant reacts immediately with the adsorbed first precursor. In some embodiments, the second reactant reacts only after a source of activation such as plasma is applied. Such plasma exposure may be applied temporally. The chamber may then be evacuated again to remove unbound second reactant molecules. As described above, in some embodiments, the chamber may not be completely evacuated. Exposures described above may be part of a temporal ALD process whereby a substrate is exposed to each exposure in temporally separated exposures. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S, Pat. No. 8,728,956), filed Apr. 11, 2011, and titled "PLASMA ACTIVATED CONFORMAL FILM DEPOSITION," which is herein incorporated by reference in its entirety. Plasma activation may be performed by generating the plasma in situ, i,e., within the chamber, to generate reactive species in the chamber where the substrate is housed and contacting the substrate surface of adsorbed precursors with the reactive species. In some cases, plasma activation may be performed by generating a plasma in a remote region or generator, and reactive species from the plasma may then be delivered to the chamber housing the substrate to thereby contact the surface of adsorbed precursors with the reactive species. In various embodiments, a. plasma generator that may be suitable for PEALD is a capacitively coupled plasma generator. In various embodiments, a plasma generator that may be suitable for PEALD is an inductively coupled plasma generator. While some ALD and PEALD embodiments are described herein, it will be understood that various disclosed embodiments may be applicable to either ALD or PEALD processes.

The disclosed embodiments can be used to deposit a variety of films, including, but not limited to, silicon oxide, silicon nitride, metal oxides, metal nitrides, metal carbides, other oxides, nitrides, carbides, oxynitrides, oxycarbides, and the like.

An important consideration for PEALD processes, the details of which are further described below, is setting the power level of a radio-frequency (RE) generator, which produces plasma (e.g., reactive ions and/or radicals) that react with an adsorbed layer. In particular, higher power settings typically result in higher-quality films (e.g., films having a higher density and/or better wet etch properties such as a lower etch rate and less variability in etch rate). The use of higher RF power settings, however, also tends to damage underlying structures. In particular, as RF power settings are increased, the ability of reactive ions in the plasma to penetrate into and damage underlying structures increases.

An example of the relationship between RF power and wet etch rate is illustrated in FIG. 1A. FIG. 1A was created by forming various silicon oxide films in PEALD processes utilizing different RF power settings (e.g., first, second, third, fourth, and fifth films formed with respective RF power settings of approximately 3.0, 4.0, 4.5, 5.0; and 5.5 kilowatts per 300-mm wafer) and then wet etching those films to identify their wet etch rate. FIG. 1A also includes a curve fitted to the test results, which shows that the wet etch rate generally decreases with increasing RF power and also shows that the rate of change of the wet etch rate as a function of RF power is significantly lower at relatively high RF power settings (e.g., the wet etch rate does not vary much between RF power settings of 4.0 kilowatts per 300-mm wafer and RF power settings of 5.5 kilowatts per 300-min wafer).

Figure 1B:
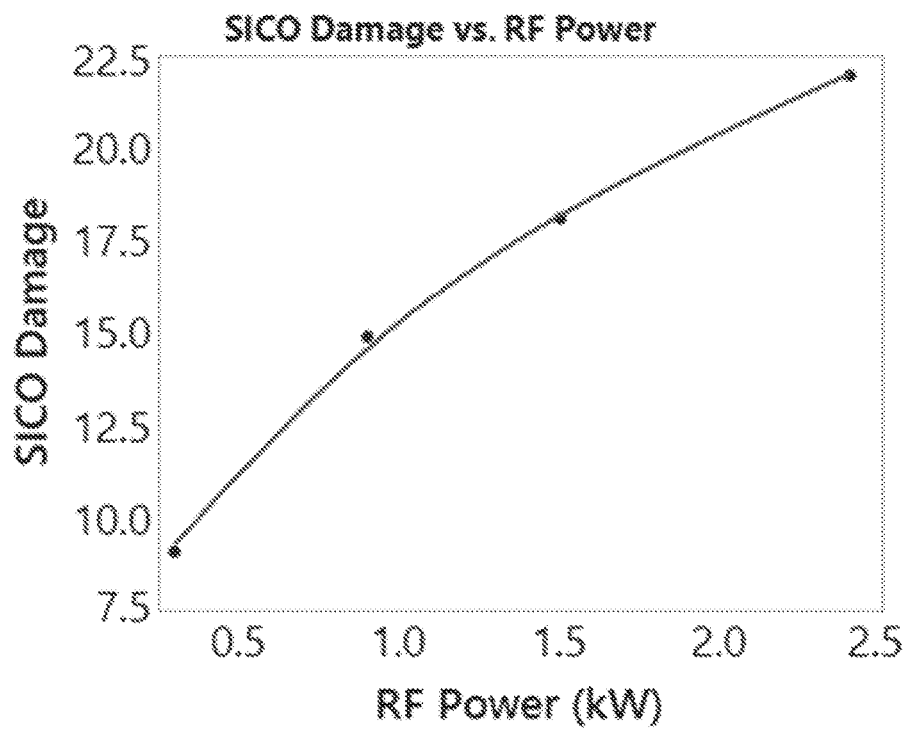
FIG. 1B is a graph depicting damage to a film resulting from PEALD processes at various plasma power levels in accordance with certain disclosed embodiments.

An example of the relationship between RF power and damage to underlying structures is illustrated in FIG. 1B. FIG. 1B was created by forming an initial silicon oxycarbide (SiCO) film of a known initial thickness, depositing thereupon a silicon dioxide ($SiO_2$) film with 30 cycles of PEALD deposition at various RF power settings, etching away the $SiO_2$ film, and then measuring any change in thickness of the initial SiCO film relative to its initial thickness. FIG. 1B illustrates the measured changes in thickness in angstroms (A) of the SiCO films following PEALD deposition processes at 300 watts, 1 kilowatt, 1.5 kilowatts, and 2.5 kilowatts per 300-mm wafer. FIG. 1B also includes a curve fitted to the test results. As FIG. 1B shows, the amount of damage to underlying structures generally increases with increases in RF power settings.

Figure 1C:
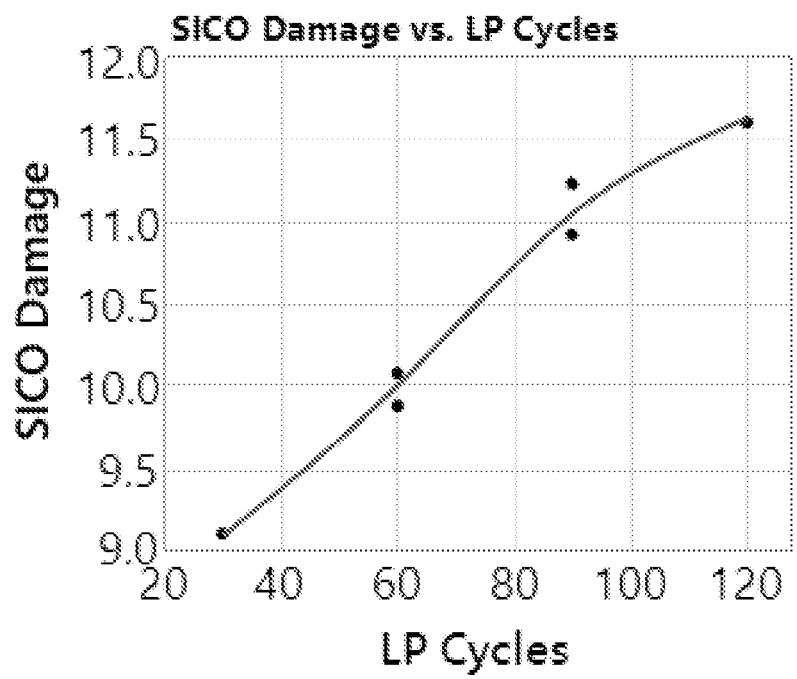
FIG. 1C is a graph depicting damage to a film resulting from PEALD processes having various numbers of cycles in accordance with certain disclosed embodiments.

FIG. 1C illustrates an example of the relationship between damage to underlying structures and the number of low-power PEALD cycles (e.g., PEALD cycles with RF power set to 300 watts per 300-mm wafer). As shown in FIG. 1C, approximately 9.2 angstroms of the SiCO film is lost after 30 PEALD cycles at 300 watts, while approximately 11.6 angstroms of the SiCO film is lost after 120 PEALD cycles at 300 watts per 300-mm wafer.

Figure 1D:
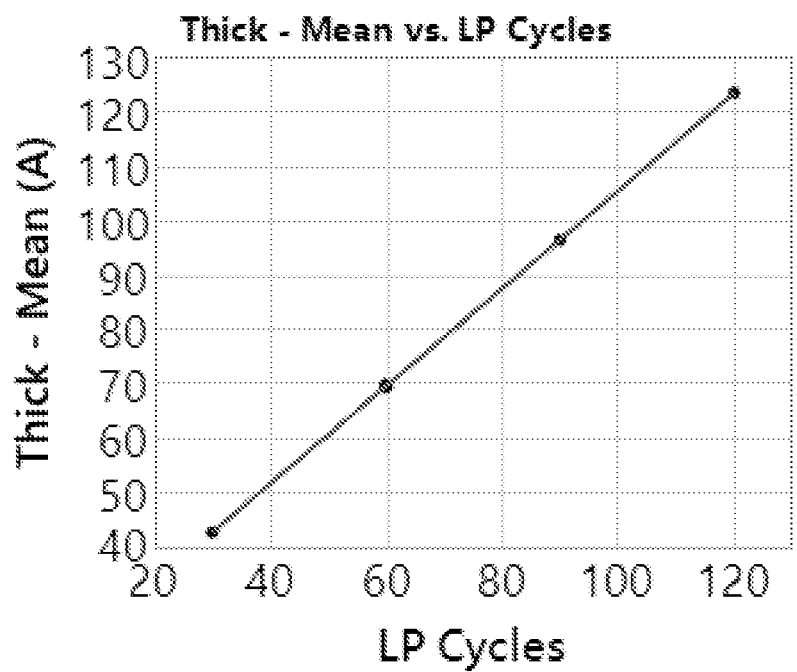
FIG. 1D is a graph depicting thickness of a film resulting from PEALD processes having various numbers of cycles in accordance with certain disclosed embodiments.

FIG. 1D illustrates an example of the relationship between the mean thickness of the deposited silicon dioxide ($SiO_2$) film and the number of low-power PEALD cycles (e.g., PEALD cycles with RF power set to 300 watts per 300-mm wafer). As shown in FIG. 1D, the thickness of the deposited film increases approximately linearly with the number of PEALD cycles.

The present disclosure includes techniques that can improve film quality by utilizing high-power RF settings, while protecting sensitive components from damage resulting from the high-power RF settings. One such technique involves the formation of a screening layer using low-power RE settings, and then depositing a high-quality film using high-power RF settings. The screening layer can absorb, deflect, or otherwise block damaging ions during the high-power RE PEALD cycles, thus allowing the formation of a high-quality film without excessive damage to underlying structures. In various embodiments, the ALD process transitions from low-power RF to high-power RF gradually, rather than as a single step change.

Figure 1E:
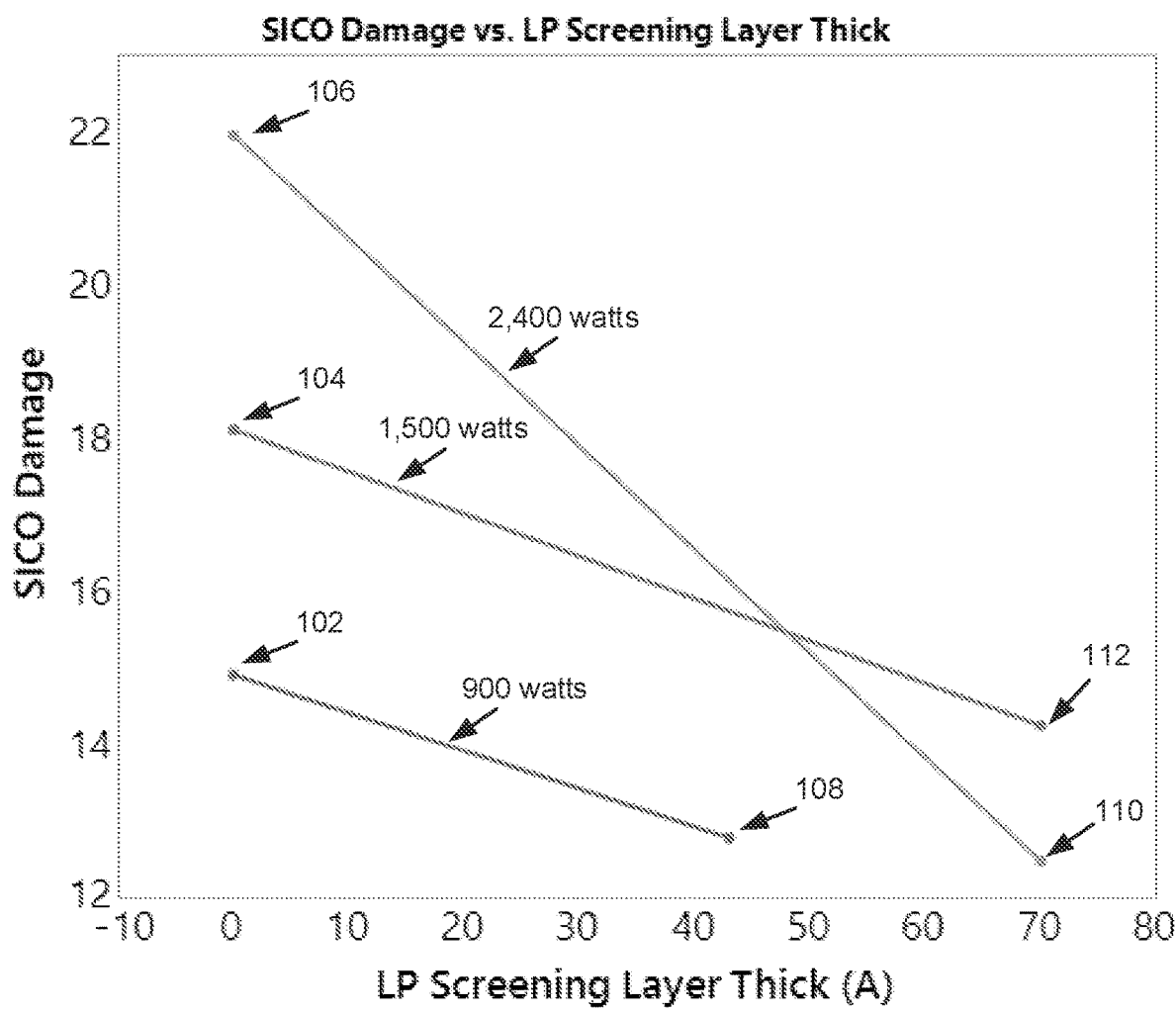
FIG. 1E is a graph depicting damage to a film resulting from PEALD processes at various plasma power levels and with screening layers of various thicknesses in accordance with certain disclosed embodiments.

Experimental results showing the effectiveness of a screening layer in reducing damage to underlying structures are illustrated in FIG. 1E. The data points of FIG. 1E include the amount of damage to a silicon oxycarbide film (e.g., lost thickness of an initial SiCO film) after 30 cycles of PEALD silicon dioxide film deposition at the relatively high RF-power settings of 900 watts, 1.5 kilowatts, and 2.4 kilowatts per 300-mm wafer. Data point 102 shows the amount of damage after 30 PEALD cycles at 900 watts and data point 104 shows the amount of damage after 30 PEALD cycles at 900 watts but with a screening layer approximately 42 angstroms thick. Data point 104 shows the amount of damage after 30 PEALD cycles at 1,500 watts and data point 106 shows the amount of damage after 30 PEALD cycles at 1,500 watts but with a screening layer approximately 70 angstroms thick. Data point 106 shows the amount of damage after 30 PEALD cycles at 2,400 watts and data point 108 shows the amount of damage after 30 PEALD cycles at 2,400 watts but with a screening layer approximately 70 angstroms thick. The screening layers were deposited using the same materials as the overlaid high-RF power layers (in other words, the screening layers were also formed from silicon oxycarbide) and were deposited with the RF-power set to 300 watts per 300-mm wafer.

The damage measurements shown in FIG. 1E include any damage resulting from deposition of the screening layers themselves. From FIGS. 1C and 1D, the amount of damage resulting from deposition of just the screening layers can be estimated. In particular and for a screening layer of approximately 70 angstroms, FIG. 1D indicates that approximately 60 cycles at an RF-power setting of 300 watts per 300-mm wafer is sufficient to form a 70 angstrom thick screening layer and FIG. 1C indicates that formation of such a layer would result in approximately 10.0 angstroms of damage. As shown in FIG. 1E, the amount of damage, in embodiments with a screening layer, even at the highest-RF power setting of 2,400 watts per 300-mm wafer is only approximately 15 angstroms of which approximately 10.0 angstroms is actually from formation of the screening layer. In contrast, the amount of damage, in embodiments lacking a screening layer, goes as high as 22 angstroms in the 2,400 watt embodiment (and with no damage from formation of the screening layer). Thus, FIG. 1E illustrates that a screening layer is highly effective in reducing damage.

One embodiment serving to address the issues described herein with respect to film quality and underlying layer damage as a function of RF power includes the formation of a first screening layer followed by the formation of a second final layer, as illustrated in FIGS. 2A and 2B. In particular, FIG. 2A depicts the RF power as a function of ALD cycle count, while FIG. 2B depicts variations in the films deposited according to FIG. 2A. In some arrangements, the low-power (LP) screening layer is formed with a sufficient number of PEALD cycles to achieve a thickness of between 30 and 50 angstroms (Å) using a low RF power setting such as 300 watts per 300-mm wafer. The high-power (HP) final layer is then formed above the LP screening layer with a sufficient number of PEALD cycles to achieve a desired thickness and using a relatively high RF power setting such as 900 watts, between 900 and 1.5 kilowatts, 1.5 kilowatts, between 1.5 and 2.4 kilowatts, 2.4 kilowatts, greater than 2.4 kilowatts, about 4.0 kilowatts, about 4.5 kilowatts, about 5.0 kilowatts, or about 5.5 kilowatts per 300-mm wafer.

One potential drawback with the bi-layer arrangement of FIGS. 2A and 2B is that etching of the resulting films can, in some instances, result in removal of all the high-quality, HP layer, thereby exposing the LP screening layer to etching. Since the LP screening layer is relatively low quality (e.g., was deposited using relatively low RF power settings), the wet etch rate of the LP screening layer is relatively high and variable (see, e.g., FIG. 1A and the associated discussion above). Because of the high and variable wet etch rate of the LP screening layer, it may be an undesirable result for the LP screening layer to be exposed to etching.

In another embodiment, RF power settings may be gradually ramped up during PEALD deposition to provide a series of layers with increasing quality as illustrated in FIGS. 2C and 2D In particular, FIG. 2C illustrates the deposition of layers using six distinct (P1-P6) RF power levels and FIG. 2D illustrates the density or quality variation in the resulting film layers. With the arrangement of FIGS. 2C and 2D, the lower layers (e.g., the layers deposited with relatively low RF power settings) serve as screening layers that block damage from later depositions involving higher RF power settings. The embodiment of FIGS. 2C and 2D recognizes that the highest safe RF power settings (e.g., the highest RF power settings not resulting in excessive damage) increases as the thickness of the screening layers (e.g., the previously deposited layers) increases. As a specific example, layer 200 may be deposited at a first RF power level that is determined to keep damage below an acceptable threshold, then layer 202 may be deposited at a second RF power level, which is higher than the first power level, and where the second RF power level is determined to keep damage below an acceptable threshold when considering the screening properties of layer 200. Similarly, layers 204, 206, 208, and 210 may be deposited at progressively higher RF power levels, where the RF power level used in depositing each layer is selected to keep damage below an acceptable threshold while considering the screening properties of the respective underlying layers. In general, an acceptable threshold of damage to underlying structures may be determined by a process engineer or other person or entity depositing a film with the techniques presently disclosed. As examples, the acceptable threshold of damage to underlying structures may be defined with respect to the amount of damage resulting from a single PEALD cycle or set of PEALD cycles at one or more RF power levels or may be defined with respect to the cumulative amount of damage resulting from the deposition of an entire film (e.g., including the first and last cycles of PEALD deposition performed to deposit a particular film on a particular wafer). As more specific examples, the threshold amount of cumulative damage (e.g., the amount of one or more underlying layers that are removed) may be 6 angstroms, 8 angstroms, 10 angstroms, 12 angstroms, 14 angstroms, 16 angstroms, 18 angstroms, or 20 angstroms. The threshold amounts of per-cycle damage may be determined with reference to a desired cumulative threshold. In other words, if the desired cumulative threshold level is 10 angstroms, the per-cycle damage thresholds may be determined by dividing the cumulative threshold level of 10 angstroms across all of the PEALD cycles, where that division may take into account that the earlier cycles, being formed on or nearly on top of the underlying layers and lacking significant screening from deposited PEALD layers, are likely to have a higher per-cycle damage rate even with relatively low RF power settings. While different regions of the deposited film are referred to as "layers," they may, in some embodiments, not be separated by clear boundaries, particularly if the ALD process transitions from low-power RF to high-power RF gradually.

While FIGS. 2A and 2B illustrate an embodiment utilizing 6 distinct RF power settings, this is merely one potential arrangement. In general, any desired number of distinct RF power settings may be used. For example, a distinct RF power setting may be used for each PEALD cycle (or group of cycles). In other words, the RF power setting may be ramped, or incrementally increased, after each cycle of PEALD deposition (or after some number of PEALD cycles), In some embodiments, the RF power is ramped only twice, meaning that the ALD film is deposited in three distinct RF power settings. In general, increasing the number of distinct RF power settings may smooth transitions between the lower-quality lower layer(s) and the higher-quality upper layer(s). Additionally, increasing the number of distinct RF power settings may help to reduce the overall thickness, while maintaining high-quality upper layers and ensuring sufficient screening from lower layers.

In general, the lowest RF power setting is set low enough to avoid damage above a design threshold and the highest RF power setting is set high enough to provide desired film properties.

As examples, potential values for the lowest RF power setting (on a per 300-mm wafer basis) are less than 200 watts, between 200 and 250 watts, between 250 and 300 watts, between 300 and 350 watts, between 350 and 400 watts, between 400 and 450 watts, between 450 and 500 watts, between 500 and 550 watts, between 550 and 600 watts, or more than 600 watts. Similarly, potential values, as examples, for the highest RF power setting (on a per 300-mm wafer basis) are less than 2.0 kilowatts, between 2.0 and 2.5 kilowatts, between 2.5 and 3.0 kilowatts, between 3.0 and 3.5 kilowatts, between 3.5 and 4.0 kilowatts, between 4.0 and 4.5 kilowatts, between 4.5 and 5.0 kilowatts, between 5.0 and 5.5 kilowatts, between 5.5 and 6.0 kilowatts, more than 6.0 kilowatts. For the examples of highest and lowest RF power settings, "between" is inclusive of the end points of each range. In other words, an RF power setting "between 500 and 550 watts" includes both 500 and 550 watt settings as well as all watt settings in-between 500 and 550 watts.

In some embodiments, there may be a restriction in the maximum difference in RF power setting between the first and last PEALD cycles (e.g., between the lowest and highest RF power settings) and/or there may be a restriction in the maximum change in RF power setting between two successive PEALD cycles. As an example, the maximum change in RF power setting between two successive PEALD cycles may be a 25% increase in wattage per wafer (e.g., if a cycle is performed at 1,000 watts per wafer, the next cycle may be limited to no more than 1,250 watts). As another example, the maximum change in RF power setting between two successive PEAT D cycles may be a 500 watt increase in wattage per wafer (e.g., if a cycle is performed at 1,000 watts per wafer, the next cycle may be limited to no more than 1,500 watts).

In some embodiments, control logic (e.g., software) may be provided that automatically raises RF power settings as a function of cycle number. In some cases, the logic applies particular levels of power that is pre-specified for each distinct ALD cycle. In some cases, the logic applies levels of power that are determined, at least in part, by conditions within the process chamber. In certain embodiments, the logic controls the RF power settings so that they increase monotonically over the course of the ALD film formation process.

Various methods may be employed to determine a sequence of RF power settings for the ALD process. As an example, a user may perform a series of tests to determine the RF power setting limit as a function of cycle number (e.g., the highest RF power setting, for each PEALD cycle or each group of PEALD cycles, where the power setting doesn't result in damage above a threshold). The user or an automated system may then generate a calibration curve of maximum RF power as a function of PEALD cycle number (or as a function of another relevant metric such as film thickness). The calibration curve may be defined by a mathematical expression or may be a series for power values for the distinct ALD cycles. In one implementation of the latter case, the values are provided in a lookup table. In some embodiments, the calibration curve takes the form of a linear expression (i.e., Power=m(ALD cycle number) +b). In some embodiments, the calibration curve may take the form of a $3^{rd}$ degree polynomial function (e.g., RF power equals factor A times cycle count cubed plus factor B times cycle count squared plus factor C times cycle count plus factor D). The control software may be configured with such as calibration curve, so that the RF power settings track the calibration curve during PEALD processes.

Figure 3:
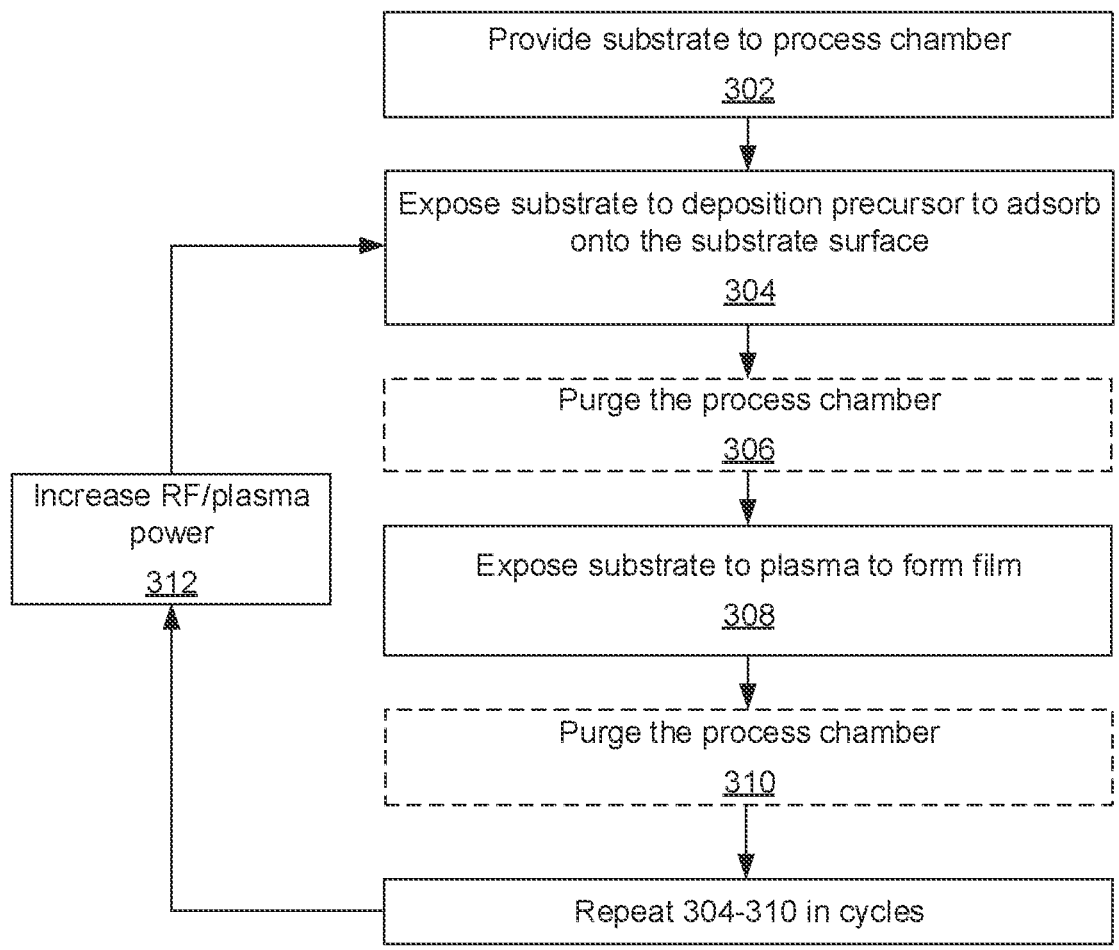
FIG. 3 is a process flow diagram depicting operations of methods performed in accordance with certain disclosed embodiments.

FIG. 3 is a process flow diagram depicting operations performed in accordance with certain disclosed embodiments. Operations in FIG. 3 may be performed in a process chamber having one or more stations. In various embodiments, the process chamber has four stations. Suitable tools are further described below in the Apparatus section.

Operations in FIG. 3 may be performed at a chamber pressure between 1 mTorr and about 10 Torr, or between 1 mTorr and 500 mTorr, or between about 1 Torr and about 10 Torr. Operations in FIG. 3 may be performed at a substrate temperature between about −50° C. to about 900° C., or between about 100° C. and about 400° C., or between about 200° C. and about 300° C., or between about 400° C. and 550° C., or between about 400° C., and about 600° C., or between about 400° C., and about 200° C., or between about 400° C., and about 300° C. It will be understood that a substrate temperature is defined as the temperature for which a pedestal holding a substrate is set at to thereby heat the substrate to the desired temperature.

In operation 302, a substrate is provided to the process chamber. The substrate may be a silicon wafer, e.g.. a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, semiconductors (e.g., silicon), and metal layers.

The substrate may be patterned in various embodiments. The pattern may include topography, which may include vias, holes, and trenches having any desired dimensions and aspect ratios.

In operation 304, the substrate is exposed to a precursor for a duration sufficient to adsorb the precursor onto a surface of the substrate to form an adsorbed layer of the precursor.

The duration sufficient to adsorb the precursor depends on the precursor used and partial pressure of the precursor. Other process conditions that may be relevant to the duration sufficient to adsorb the precursor include, but are not limited to, substrate temperature, chamber pressure, presence of other gases in chamber, precursor flow rate, precursor selected, surface chemistry of substrate, and surface topography of substrate.

In various embodiments, the precursor may be delivered to the process chamber housing the substrate using a carrier gas, which may be an inert gas such as argon. In some embodiments, the carrier gas is diverted prior to flow into the chamber.

In operation 306, the process chamber is optionally purged. A process chamber housing the substrate may be purged to remove precursors that are not adsorbed onto the substrate surface. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, the purge gas is the same as a carrier gas used to deliver the precursor to the chamber. In some embodiments, operation 306 may include one or more evacuation subphases for evacuating the process chamber. Alternatively, it will be appreciated that operation 306 may be omitted in some embodiments. Operation 306 may have any suitable duration, such as between about 0.1 seconds and about 2 seconds, In operation 318, the substrate is exposed to a second reactant such as a plasma to convert adsorbed precursor to a film. In cases of PEALD, plasma is provided to activate the second reactant, such as an oxygen-containing gas or oxidant, into ions and radicals and other activated species, which react with the adsorbed layer of the first precursor. For example, the plasma may directly or indirectly activate the oxygen-containing gas phase molecules to form oxygen radicals or ions. Reactive species may have a particular plasma energy, which may be determined at least in part by the radio frequency plasma power (RF power).

In operation 318, the substrate is directly or indirectly exposed to a particular radio frequency plasma power (RF power). The amount of reactive species present in the chamber during deposition may also be modulated by changing the plasma power or plasma time. However it will be understood that in various embodiments described herein Where PEALD cycles are modulated from one cycle to another cycle, the amount of reactive species may be modulated by changing only the RF power settings of the RF generator to generate the desired screening and final layers.

In various embodiments, the plasma is an in-situ plasma, such that the plasma is formed directly above the substrate surface in the chamber. Plasmas for ALD processes may be generated by applying a radio frequency (RF) field to a gas using two capacitively coupled plates. The plasma generates reactive species. Reactive species may include electrons, ions, radicals, and neutral species. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerhea.ds and substrate support pedestals. In various embodiments, the pedestal is a powered pedestal and the chamber includes a grounded showerhead. In some embodiments, the pedestal is grounded and the showerhea.d is powered, It will be appreciated that plasmas for ALD processes may be formed by one or more suitable methods other than capacitive coupling of an RF field to a gas. In some embodiments, the plasma is a remote plasma, such that a plasma is ignited in a remote plasma generator upstream of the chamber, then delivered to the chamber where the substrate is housed.

In operation 310, the process chamber is again optionally purged to remove any excess byproducts from the reaction between the precursor and the second reactant. The process conditions for operation 310 may be any of those described above with respect to operation 306. In some embodiments, the chamber is purged using an inert gas flowed at a flow rate between about 5 slm and about 70 slm.

Operations 304 to 310 are repeated multiple times, each time constituting one cycle of PEALD. After one or more PEALD cycles (e.g., repetitions of operations 304-310), operation 312 may be performed and the RF power setting increased. Operation 312 may be performed after each cycle of PEALD or after each set of PEALD cycles (e.g., after every 5, 10, 15, 20, 25, 30, 40, 50, 60, 70, 80, 90, or 100 PEALD cycles). In some embodiments, the RF power setting is low (e.g., approximately 300 watts per 300-mm wafer) for the initial cycle(s) of the PEALD deposition to enable formation of a screening layer without damaging underlying structures. Then, the RF power setting is incrementally raised (in as many increments as desired) such that later layers have higher quality (e.g., lower wet etch rates). The rate of increase of the RF power setting may be selected to be slow enough that any increase in damage potential from increased RF power settings is sufficiently offset by an increase in the thickness of underlying screening layers, such that the amount of damage to underlying structures (e.g., structures underlying the initial screening layer(s)) remains below a threshold, where that threshold may be determined by a process engineer. In some embodiments, the ramp of RF power settings may be configured to limit the total amount of damage to underlying structures. In some other embodiments, the ramp of RF power settings may be configured to limit the amount of damage to underlying structures from a single cycle or a single set of cycles of PEALD deposition.

It will be understood that while silicon oxide films are described herein, applications of certain disclosed embodiments may be applicable for depositing other silicon-containing films, including, but not limited to, silicon nitride, silicon carbide, silicon oxynitride, silicon carboxynitride, silicon oxycarbide, and poly-silicon.

Although PEALD is described herein as an example, certain disclosed embodiments can be applied to any ALD technique, including thermal and spatial ALD, and also although RF power is described here, dose, purge, conversion time and/or pressure can also be modulated.

Apparatus

Figure 4:
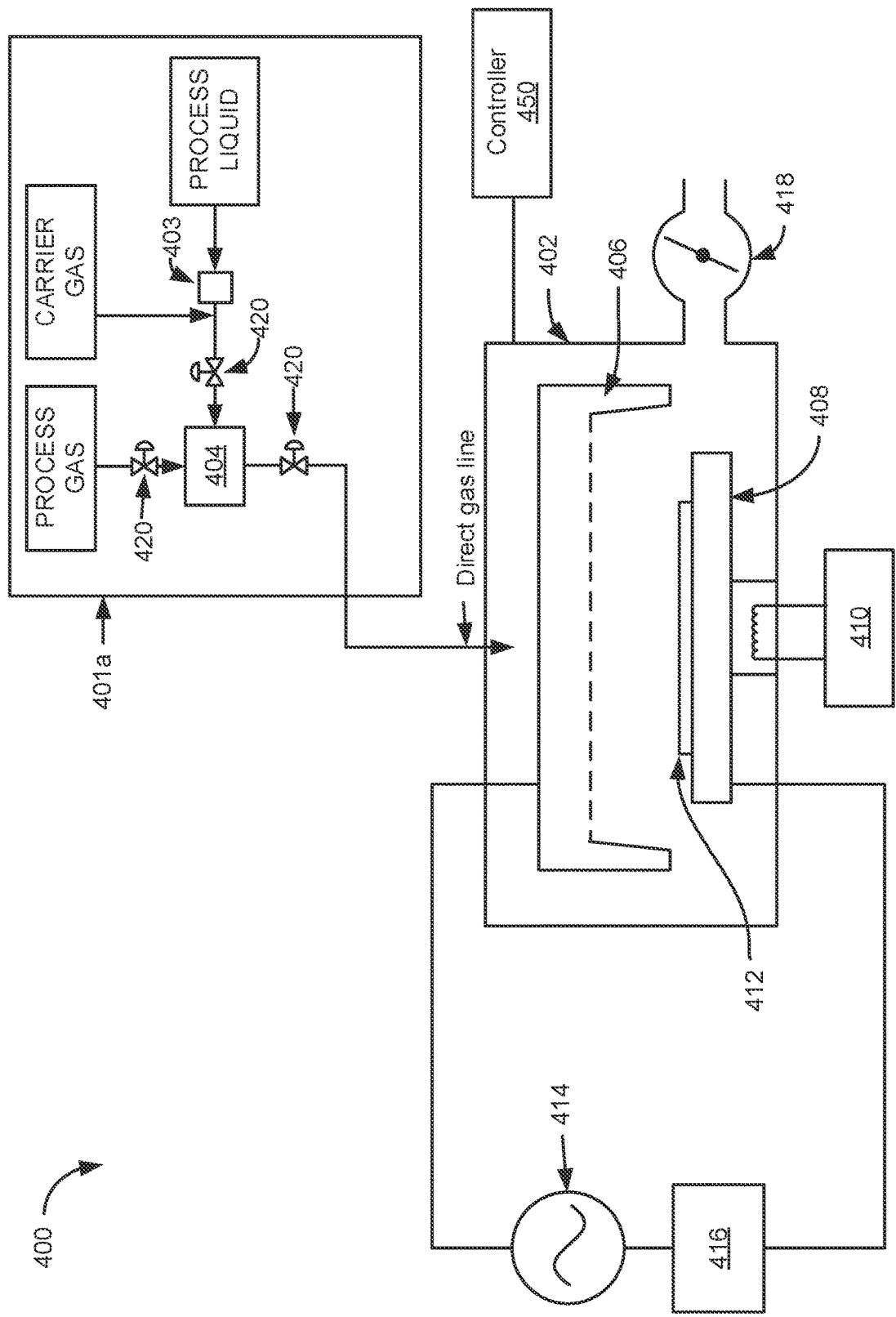
FIG. 4 is a schematic diagram of an example process chamber for performing disclosed embodiments.
Figure 5:
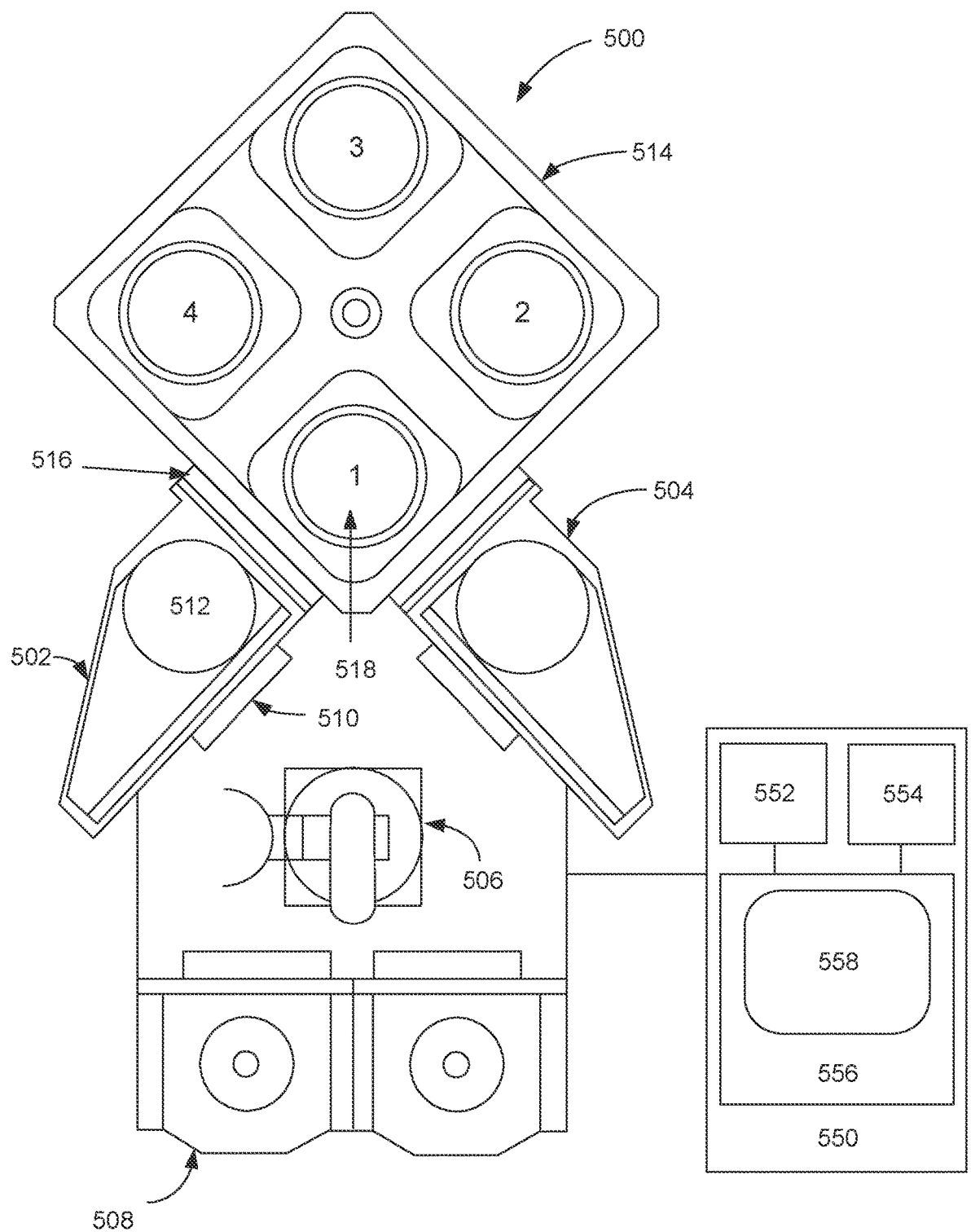
FIG. 5 is a schematic diagram of an example process tool for performing disclosed embodiments.

FIG. 4 depicts a schematic illustration of an embodiment of a plasma-enhanced atomic layer deposition (PEALD) process station 400 having a process chamber body 402 for maintaining a low-pressure environment. A plurality of PEALD process stations 400 may be included in a common low pressure process tool environment. For example, FIG. 5 depicts an embodiment of a multi-station processing tool 500. In some embodiments, one or more hardware parameters of PEALD process station 400 including those discussed in detail below may be adjusted programmatically by one or more controllers 450.

PEALD process station 400 fluidly communicates with reactant delivery system 401a for delivering process gases to a showerhead 406. Reactant delivery system 401a includes a mixing vessel 404 for blending and/or conditioning process gases, such as a silicon precursor gas, or second reactant gas (e.g., oxygen and argon), for delivery to showerhead 406. One or more mixing vessel inlet valves 420 may control introduction of process gases to mixing vessel 404. Argon plasma may also be delivered to the showerhead 406 or may be generated in the PEALD process station 400.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel, In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to PEALD process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MEM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of at least about 250° C., or in some embodiments, less than about 300° C., such as about 250° C., during deposition of silicon nitride films as described in disclosed embodiments. In some embodiments, the pedestal is set at a temperature between about −50° C. and about 900° C., or between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for PEALD process station 400 may be provided by butterfly valve 418. As shown in the embodiment of FIG. 4, butterfly valve 418 throttles a vacuum provided by a downstream vacuum pump (not shown). However, in some embodiments, pressure control of PEALD process station 400 may also be adjusted by varying a flow rate of one or more gases introduced to the PEALD process station 400.

In some embodiments, a position of showerhead 406 may be adjusted relative to pedestal 408 to vary a volume between the substrate 412. and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more controllers 450.

In some embodiments where plasma may be used as discussed above, showerhead 406 and pedestal 408 may electrically communicate with a radio frequency (RF) power supply 414 and matching network 416 for powering a plasma. In various embodiments, the pedestal is a powered pedestal and the chamber includes a grounded showerhead. In some embodiments, the pedestal is grounded and the showerhead is powered, The RF power supplied by RF power supply 414 during conversion may be controlled using the controller 450 (e.g., to ramp up the RF power as described in connection with at least FIGS. 2A-2D and 3).

In some embodiments, plasma energy is modulated using a combination of plasma power (e.g,, RF power) and conversion duration. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to initiate the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor), instructions for setting a flow rate of a carrier gas (such as argon), instructions for setting a first RF power level, and time delay instructions for the first recipe phase. A second, subsequent recipe phase may include instructions for modulating or stopping a flow rate of an inert and/or a reactant gas, instructions for modulating a flow rate of a carrier or purge gas, instructions for setting a second RF power level, and time delay instructions for the second recipe phase. A third recipe phase may include instructions for modulating a flow rate of a second reactant gas, instructions for modulating the duration of flow of the second reactant gas, instructions for modulating the flow rate of a carrier or purge gas, instructions for setting a third RF power level, and time delay instructions for the third recipe phase. A fourth, subsequent recipe phase may include instructions for modulating or stopping a flow rate of an inert and/or a reactant gas, and instructions for modulating a flow rate of a carrier or purge gas, instructions for setting a fourth RF power level, and time delay instructions for the fourth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in sonic embodiments, a process station may be switchable between an ALD and plasma-enhanced ALD process mode. Additionally or alternatively, in sonic embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

It should be understood that the various references to RF power settings of the present disclosure are generally intended, unless otherwise indicated, to refer to the RF power setting per wafer. In embodiments involving multiple process stations in a multi-station processing tool, one or more RF power sources may be provided that serve multiple process stations (e.g., simultaneously and/or sequentially). In embodiments in which a single RF power source serves multiple process stations, the per-wafer power setting of the RF power source may be multiplied by the number of process stations being simultaneously provided with plasma at a desired power level. In other words, when the present disclosure describes an RF power setting of 300 watts, it should be understood that the RF power setting reflects a per-wafer value of 300 watts and that, in multi-station processing tools, the actual RF power setting of the RF power source may be the per-wafer power setting multiplied by the number of stations.

Moreover, it should be understood that the various references to RF power settings of the present disclosure are generally intended, unless otherwise indicated, to refer to the RF power setting used with a 300-mm wafer. The RF power settings described herein may be adjusted when depositing material on substrates or wafers having dimensions other than that of a 300-mm wafer. In such embodiments, the experiments of FIGS. 1A, 1B, 1C, 1D, and 1E can be repeated with a substrate or wafer (having dimensions other than a 300-mm wafer) to identify an appropriate range of RF power settings, including both low power settings for formation of screening layer(s) and high power settings for formation of high quality layers, while taking into account the desired damage thresholds and film qualities goals of a process engineer, a substrate or wafer designer, or other relevant party.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of multi-station processing tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of multi-station processing tool 500. System controller 550 executes system control software 558 stored in mass storage device 554, loaded into memory device 556, and executed on processor 552. Alternatively, the control logic may be hard coded in the system controller 550. Applications Specific integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by multi-station processing tool 500. System control software 558 may be configured in any suitable way, For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of multi-station processing tool 500.

A process gas control program may include code for controlling gas composition (e.g., iodine-containing silicon precursor gases, and nitrogen-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of multi-station processing tool 500. Non-limiting examples of process tool sensors that may be monitored include mass flow controllers, pressure sensors such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices 556 and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a. tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits tray include chips in the form of firmware that store program instructions. digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an PEALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing a film, the method comprising:
   providing a substrate to a process chamber;
   depositing a first amount of a material over the substrate in a first plasma-enhanced atomic layer deposition (PEALD) cycle, the first PEALD cycle comprising:
      exposing the substrate to a precursor under conditions allowing the precursor to adsorb onto a surface of the substrate, thereby forming a first adsorbed layer of the precursor; and
      exposing the first adsorbed layer of the precursor to a first plasma generated using a first plasma power level;
   depositing a second amount of the material over the substrate in a second PEALD cycle, the second PEALD cycle comprising:
      exposing the substrate to the precursor under conditions allowing the precursor to adsorb onto the first amount of the material, thereby forming a second adsorbed layer of the precursor; and
      exposing the second adsorbed layer of the precursor to a second plasma generated using a second plasma power level, wherein the second plasma power level is greater than the first plasma power level and wherein the second PEALD cycle is performed after the first PEALD cycle; and
   depositing a third amount of the material over the substrate in a third PEALD cycle, the third PEALD cycle comprising:
      exposing the substrate to the precursor under conditions allowing the precursor to adsorb onto the second amount of the material, thereby forming a third adsorbed layer of the precursor; and exposing the third adsorbed layer of the precursor to a third plasma generated using a third plasma power level, wherein the third plasma power level is greater than the second plasma power level and wherein the third PEALD cycle is performed after the second PEALD cycle, wherein the first amount of material and the second amount of the material comprise screening layers configured to block damage from deposition of the third amount of material, and wherein at least one of the second plasma power level or the third pasma power level is determined based at least in part on a damage threshold and are determined based on properties of the screening layers, the damage threshold being a per-cycle damage threshold determined based on a cumulative damage threshold indicating a maximum amount of one or more underlying layers that can be removed, wherein the per-cycle damage threshold accounts for a larger number of underlying layers removed during deposition of the first amount of material compared to the second amount of material.

2. The method of claim 1, wherein the substrate comprises a 300-mm wafer, wherein the first plasma power level is less than 1.0 kilowatts for the 300-mm wafer, and wherein the third plasma power level is greater than 2.0 kilowatts for the 300-mm wafer.

3. The method of claim 1, wherein the substrate comprises a 300-mm wafer, wherein the first plasma power level is less than 500 watts for the 300-mm wafer, and wherein the third plasma power level is greater than 3.5 kilowatts for the 300-mm wafer.

4. The method of claim 1, wherein the first plasma power level is no more than one-half of the second plasma power level.

5. The method of claim 1, wherein the substrate comprises a 300-mm wafer, wherein the first plasma power level is less than 1.0 kilowatts for the 300-mm wafer, and wherein the first PEALD cycle is repeated, including using the first plasma power level, until a thickness of a deposited material exceeds 20 angstroms.

6. The method of claim 1, wherein the first PEALD cycle is repeated at least twenty times before the second PEALD cycle is performed.

7. The method of claim 1, further comprising:
depositing a fourth amount of the material over the substrate in a fourth PEALD cycle, the fourth PEALD cycle comprising:
exposing the substrate to the precursor under conditions allowing the precursor to adsorb onto the surface of the substrate, thereby forming a fourth adsorbed layer of the precursor; and
exposing the fourth adsorbed layer of the precursor to a fourth plasma generated using a fourth plasma power level, wherein the fourth plasma power level is greater than the third plasma power level and wherein the fourth PEALD cycle is performed after the third PEALD cycle.

8. The method of claim 7, wherein the substrate comprises a 300-mm wafer, wherein the first plasma power level is less than 500 watts for the 300-mm wafer, and wherein the fourth plasma power level is greater than 3.5 kilowatts for the 300-mm wafer.

9. The method of claim 1, wherein the material comprises silicon oxide.

10. A method of depositing a film, the method comprising:
receiving a substrate in a process chamber; and
depositing a material over the substrate in a plurality of plasma-enhanced atomic layer deposition (PEALD) cycles, each cycle comprising:
exposing the substrate to a precursor under conditions allowing the precursor to adsorb onto a surface of the substrate, thereby forming an adsorbed layer of the precursor; and
exposing the adsorbed layer of the precursor to a plasma provided using a radio-frequency (RF) generator with a variable power setting,
wherein depositing the material over the substrate in the plurality of PEALD cycles comprises:
setting the variable power setting of the RF generator to a first power level for a first PEALD cycle to deposit a first amount of the material,
setting the variable power setting of the RF generator to a second power level for a second PEALD cycle to deposit a second amount of the material over the first amount of material, and
setting the variable power setting of the RF generator to a third power level for a third PEALD cycle to deposit a third amount of the material over the second amount of material,
wherein the third power level is greater than the second power level,
wherein the second power level is greater than the first power level,
wherein the third PEALD cycle occurs after the second PEALD cycle,
wherein the second PEALD cycle occurs after the first PEALD cycle,
wherein the first amount of material and the second amount of material each comprise screening layers configured to block damage from deposition of the third amount of material, and
wherein at least one of the second plasma power level or the third plasma power level is determined based at least in part on a damage threshold and are determined based on properties of the screening layers, the damage threshold being a per-cycle damage threshold determined based on a cumulative damage threshold indicating a maximum amount of one or more underlying layers that can be removed, wherein the per-cycle damage threshold accounts for a larger number of underlying layers removed during deposition of the first amount of material compared to the second amount of material.

11. The method of claim 10, wherein the substrate comprises a single wafer, wherein the first power level is less than 1.0 kilowatts for the single wafer, and wherein the third power level is greater than 2.0 kilowatts for the single wafer.

12. The method of claim 10, wherein the substrate comprises a single wafer, wherein the first power level is less than 500 watts for the single wafer, and wherein the third power level is greater than 3.5 kilowatts for the single wafer.

13. The method of claim 10, wherein the first power level is no more than one-half of the third power level.

14. The method of claim 10, wherein the substrate comprises a single wafer, wherein the first power level is less than 1.0 kilowatts for the single wafer, and wherein the first PEALD cycle is repeated, including using the first power level, until a thickness of a deposited material exceeds 20 angstroms.

15. The method of claim 10, wherein the first PEALD cycle is repeated at least twenty times before the second PEALD cycle is performed.

16. The method of claim 10, wherein depositing the material over the substrate in the plurality of PEALD cycles comprises setting the variable power setting of the RF generator to a fourth power level for a fourth PEALD cycle, wherein the fourth power level is greater than the third power level, and wherein the fourth PEALD cycle occurs after the third PEALD cycle.

17. The method of claim 16, wherein the substrate comprises a single wafer, wherein the first power level is less than 500 watts for the single wafer, and wherein the fourth power level is greater than 3.5 kilowatts for the single wafer.

18. The method of claim 11, wherein the material comprises silicon oxide.

* * * * *